(12) United States Patent
Deng

(10) Patent No.: US 6,801,057 B2
(45) Date of Patent: Oct. 5, 2004

(54) SILICON-ON-INSULATOR DYNAMIC LOGIC

(75) Inventor: Xiaowei Deng, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 1 day.

(21) Appl. No.: 09/932,763

(22) Filed: Aug. 16, 2001

(65) Prior Publication Data
US 2002/0021145 A1 Feb. 21, 2002

Related U.S. Application Data

(60) Provisional application No. 60/226,397, filed on Aug. 18, 2000.

(51) Int. Cl.$^7$ .................. H03K 19/20; H03K 19/094
(52) U.S. Cl. .................. 326/121; 326/95; 326/98
(58) Field of Search .................. 326/121, 95, 98, 326/27, 28, 83

(56) References Cited

U.S. PATENT DOCUMENTS

| | | | |
|---|---|---|---|
| 5,187,686 A | * | 2/1993 | Tran et al. ............. 365/189.11 |
| 5,453,708 A | * | 9/1995 | Gupta et al. ................. 326/98 |
| 5,530,659 A | * | 6/1996 | Anderson et al. ...... 364/715.04 |
| 5,896,046 A | * | 4/1999 | Bjorksten et al. ............. 326/98 |
| 6,057,711 A | * | 5/2000 | Sessions ..................... 326/93 |
| 2001/0001229 A1 | * | 5/2001 | Hagihara ..................... 326/86 |

FOREIGN PATENT DOCUMENTS

KR  2001047544 A  * 11/1999

\* cited by examiner

Primary Examiner—Daniel D. Chang

(57) ABSTRACT

The SOI dynamic logic circuits comprises series and parallel pull-down networks (260) that comprise MOS transistors configured in series or parallel. Each pull down network comprises at least one PMOS transistor (270).

16 Claims, 3 Drawing Sheets

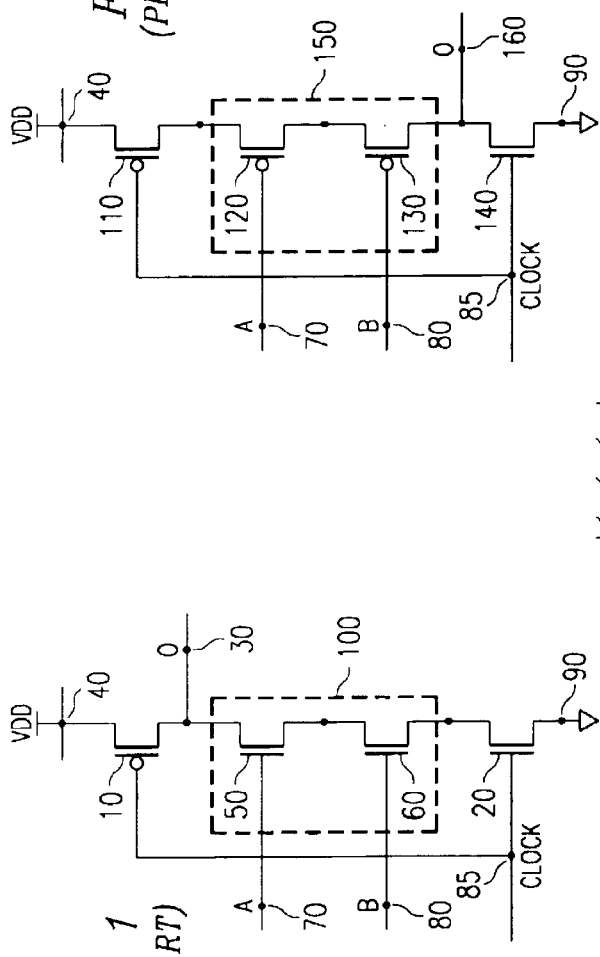
FIG. 1 (PRIOR ART)
FIG. 2 (PRIOR ART)
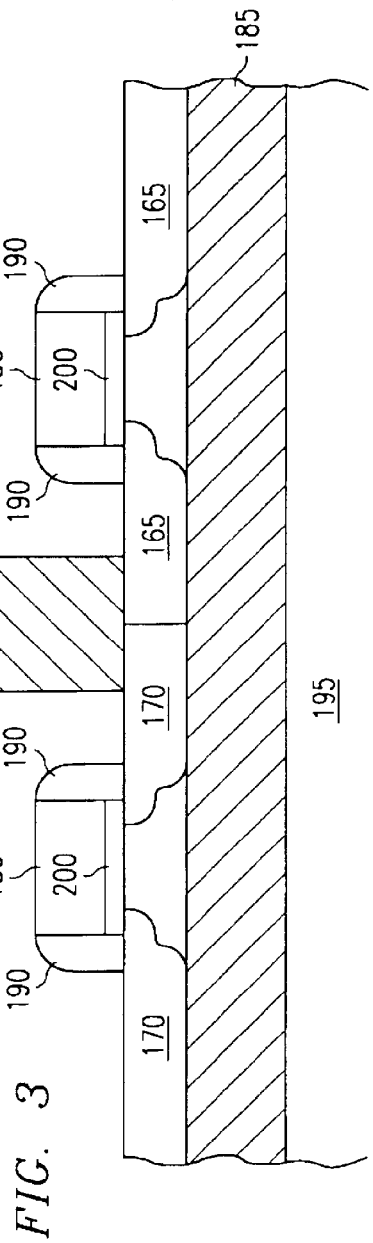
FIG. 3

US 6,801,057 B2

SILICON-ON-INSULATOR DYNAMIC LOGIC

This application claims the benefit of provisional application Ser. No. 60/226,397, filed Aug. 18, 2000.

FIELD OF THE INVENTION

The invention is generally related to the field of logic circuits and more specifically to a novel design methodology for achieving faster circuits with a more compact circuit layout.

BACKGROUND OF THE INVENTION

Designing small, fast, low-power, and reliable logic circuits is becoming more difficult with scaling. Integrated logic circuits on silicon on insulator (SOI) substrates are beginning to find increasing usage in an effort to achieve these goals. SOI refers to a silicon substrate where the top layer (in which the devices are fabricated) is separated from the "bulk" portion of the substrate by a insulator layer. This can be contrasted with bulk silicon substrates which have no buried insulator layer. In bulk CMOS circuits, NMOS transistors are fabricated in p-type wells and PMOS devices are formed in n-type wells with both well structures formed in the substrate. These well structures provide the electrical isolation required between the NMOS and PMOS transistors in CMOS logic circuits. The spacing requirement of these well structures for proper electrical isolation in bulk CMOS logic circuit fabrication has led to grouping of NMOS and PMOS transistors to maximize circuit density. In bulk CMOS circuits, basic transistor networks performing logic functions can be classified as the following three types: pull-up network (PUN), which conditionally forms a current path between the output node and the circuit power supply, pull-down network (PDN), which conditionally forms a current path between the output node and the circuit ground, and pass-transistor network (PTN), which conditionally forms a current path between the output node and the pass inputs. In general only PMOS transistors are used in a PUN, only NMOS transistors are used in a PDN, and only PMOS or only NMOS transistors are used in a PTN. In early NMOS logic circuits, both enhancement and depletion mode NMOS transistors were used as pull up devices. In these NMOS circuits however, the gate of the enhancement transistor was connected to a fixed voltage (usually the supply voltage) and the gate of the depletion transistor was connected to the output node.

In general, digital circuits can be divided into two groups, static and dynamic circuits. Dynamic circuits can be further subdivided into one-phase "domino" circuits, two-phase ratioed, and ratioless circuits. Ratioless dynamic circuits can be further divided into two-phase and four-phase circuits. Logic networks generally comprise combinational and sequential networks. Combinational networks comprise gates and programmable logic arrays, and sequential networks comprise latches, registers, counters, and read-write memory. Combinational logic networks operate without the need of any periodic clock signals. However all but the very smallest digital systems require sequential as well as combinational logic. As a practical matter, all systems employing sequential logic require the use of periodic clock signals for correctly synchronized operation. In static SOI logic circuits, combinational or sequential, clock signals are introduced only at normal gate inputs, identical to those used for logic inputs. In applications where circuit delay is important and where silicon area is at a premium, CMOS dynamic logic circuits are used. Dynamic gates require clock signals that perform a precharge function to reduce circuit delay.

Conventional SOI logic circuits are based on bulk CMOS logic with conventional SOI circuits and bulk CMOS circuits sharing the same circuit topology. Thus in conventional SOI logic circuits, only PMOS transistors are used in a PUN, only NMOS transistors are used in a PDN, and only PMOS or only NMOS transistors are used in a PTN. This circuit layout and design methodology while optimized for bulk CMOS circuits does not take full advantage of the unique properties of SOI substrates. A new circuit design methodology is therefore required that fully utilizes the properties of SOI substrates for CMOS logic circuits.

SUMMARY OF THE INVENTION

The instant invention is a dynamic logic circuit on a SOI substrate, comprising: a pull-down network comprising a plurality of series connected MOS transistors wherein at least one of said plurality of series connected MOS transistors is a NMOS transistor and at least one of said plurality of series connected MOS transistors is a PMOS transistor; a precharge circuit connected to a clock signal, a circuit supply voltage, and said pull-down network; a ground switch circuit connected to said clock signal and to said pull-down network; and an output node which is connected to a common node of said pull-down network and said precharge circuit. In addition, the precharge circuit comprises a PMOS transistor; the ground switch circuit comprises a NMOS transistor; and at least one of said MOS transistors in said pull-down network has a gate tied to a floating substrate body.

Other embodiments of the instant invention comprises: a pull-down network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor; a precharge circuit connected to a clock signal and to said first common node of said pull-down network; a ground switch circuit connected to said clock signal and to said second common node of said pull-down network; and an output node which is connected to said first common node of said pull-down network.

BRIEF DESCRIPTION OF THE DRAWINGS

In the Drawings:

FIG. 1 is a circuit diagram showing a conventional CMOS dynamic logic circuit.

FIG. 2 is a circuit diagram showing another conventional CMOS dynamic logic circuit.

FIG. 3 is a cross-section diagram showing CMOS transistors on an SOI substrate.

Figure 4:
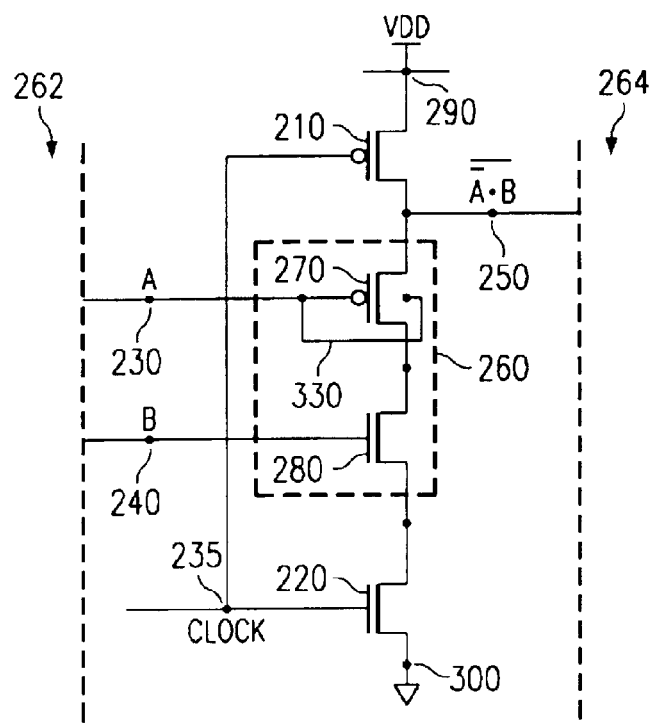
FIG. 4 is a SOI dynamic logic circuit diagram showing an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–7, the instant invention can be utilized in any semiconductor device structure. The methodology of the instant invention provides a design methodology for logic circuits.

Shown in FIG. 1 is a typical dynamic logic NAND circuit. During precharge the clock 85 is low. Here low represents a logic "0" state. In most cases this logic "0" state will be a voltage that is close to or approximately equal to the circuit ground. This turns PMOS transistor 10 on and NMOS transistor 20 off. Transistor 20 is typically known as the ground switch. Transistor 10 is the precharge transistor and charges the output node 30 to a voltage close to $V_{DD}$ 40, where $V_{DD}$ is the circuit supply voltage. The process is called precharge of the dynamic gate. At the end of the precharge cycle the clock 85 makes a low-to-high transition and the circuit goes into the discharge or logic phase. During this phase the output node 30 remains high if either of the input signals A 70 and B 80 is low. If all of the input signals A 70 and B 80 are high, both NMOS transistors 50 and 60 will conduct and the output node will be pulled down to close to the circuit ground value 90. The combination of transistors 50 and 60 comprise the pull-down network (PDN) 100 of the dynamic logic circuit.

Shown in FIG. 2 is another typical dynamic logic circuit. In this case during precharge the clock 85 is high. This high clock state turns NMOS transistor 140 on and PMOS transistor 110 off. Transistor 140 will function as the precharge transistor and charges the output node 160 to a voltage close to the circuit ground 90. At the end of the precharge cycle the clock 85 makes a high-to-low transition and the circuit goes into the discharge or logic phase. During this logic phase the output node 160 remains low if either of the input signals A 70 and B 80 is high. If all of the input signals A 70 and B 80 are low, both PMOS transistors 120 and 130 will conduct and the output node will be pulled up to close to the circuit supply voltage $V_{DD}$ 40. The combination of transistors 120 and 130 comprise the pull-up network (PUN) 150 of the dynamic logic circuit. FIGS. 1 and 2 illustrate that in general the PAN comprises NMOS transistors and the PUN comprises PMOS transistors.

NMOS and PMOS transistors fabricated on SOI substrates is shown in FIG. 3. Using SOI substrates, the source/drain p-region 165 of a PMOS transistor can abut a source/drain n-region 170 of a NMOS transistor. In this scheme, the contact or silicide 175 that connects the p-region 165 and the n-region 170 can be optional in the "logic" sense if the p-n junction between the p-region 165 and the n-region 170 is never reversed biased. Unlike bulk CMOS technology, therefore, in SOI technology the physical connection of a PMOS transistor and an NMOS transistor along their source/drain regions consumes a silicon area that is compatible to the connection of two NMOS transistors or two PMOS transistors along their source/drain diffusions. Based on this unique property of SOI technology, a new logic for SOI termed here as "SOI logic" is defined in which both NMOS and PMOS transistors can be used in a basic transistor network. Specifically, NMOS transistors can be used in a PUN in addition to PMOS transistors and PMOS transistors can be used in a PDN in addition to NMOS transistors. In SOI logic, the gate terminals of the NMOS transistors in the PUN are not connected to a fixed voltage or the output terminal of the PUN. In addition to PUNs and PDNs, both NMOS and PMOS transistors can be used in a PTN. The buried dielectric layer 185 and the underlying substrate 195 are also illustrated in FIG. 3 along with the transistor gate dielectric 200, gate electrode 180, and sidewall structures 190.

SOI logic is a true superset of the bulk CMOS logic. In other words, any circuit topology in bulk CMOS logic also belongs to SOI logic; however, some circuit topologies in SOI logic do not belong to bulk CMOS logic. In addition to having low-power consumption and high reliability, it is important that SOI logic circuits consume minimum space on the wafer. In the design and layout of SOI logic circuits the following guidelines will aid in achieving minimum layout space. In a series connected transistor string in a basic transistor network, separately group the PMOS transistors and the NMOS transistors as much as possible to minimize the number of contacts or silicide areas that connect the p-regions of the PMOS transistors and the n-regions of the NMOS transistors. In a series connected transistor string in a PUN or a PDN, place all the PMOS transistors above the NMOS transistors, such that the contact or silicide connecting the PMOS and NMOS transistor source/drain regions is not needed, minimizing the layout area. In addition to layout area, circuit performance can be improved using low threshold voltage techniques such as electrically connecting the transistor gate to the floating body of the SOI transistor. The gate-to-body connection can be applied to the NMOS transistors and PMOS transistors in a PUN, the PMOS transistors and NMOS transistors in a PDN, and both the PMOS and NMOS transistors in a PTN. The gate-to-body connection utilizes the body effect of the MOSFET transistor to lower the threshold voltage thus improving the transistor performance.

An embodiment of the instant invention for a SOI dynamic logic circuit is illustrated in FIG. 4. This embodiment has an output logic function of $\overline{A \cdot B}$ and logic inputs of A 230 and B 240. The precharge circuit which comprises a PMOS transistor 210 and the ground switch circuit which comprises a NMOS transistor 220 are connected to a clock signal 235. Although both 210 and 220 are shown tied to the same clock signal 235 it is possible to have independent clock signals driving either transistor. In this embodiment the PDN 260 comprises a series connection of a PMOS transistor 270 and a NMOS transistor 280. In a further embodiment one of the transistors in the PDN 260 has the gate tied to the floating substrate 330. During the precharge phase (when the clock 235 is low) the output node 250 will be charged high to approximately $V_{DD}$ 290 through the PMOS precharge transistor 210. During the subsequent discharge or logic phase (when the clock 235 is high) if logic input A 230 is low and logic input B 240 is high the output node 250 will be pulled-down by the PDN 260 to a value close to the circuit ground 300. The transistors 270 and 280 thus provide a potential conductive path from the output node 250 to the circuit ground 300. This is to be contrasted with a bulk CMOS circuit implementing the same logic function where the PDN comprises NMOS transistors. The circuit of FIG. 4 can be extended to any number of series connected PMOS and NMOS transistors in the PAN 260. In addition, the circuit shown in FIG. 4 could be a subset of a larger circuit. Thus logic inputs A 230 and B 240 could be provided by addition circuitry 262 and the logic output 250 could be connected to the other circuits 264.

Figure 5:
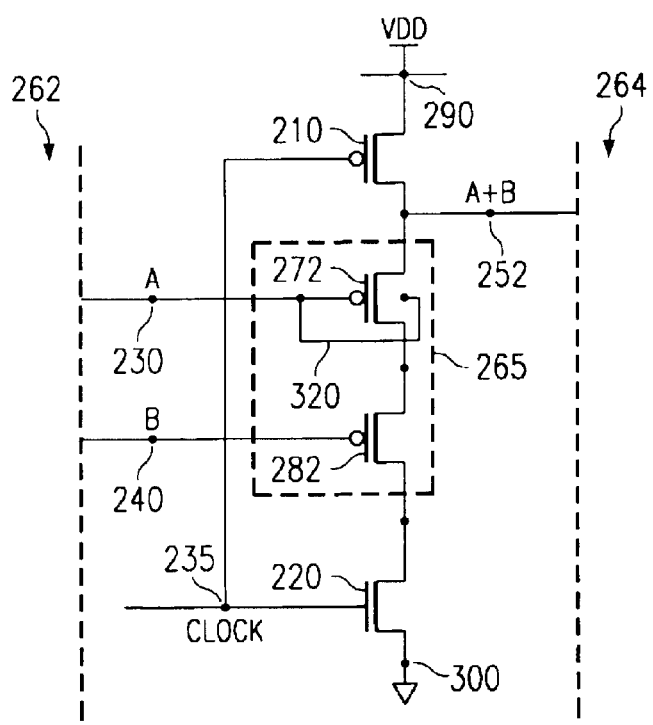
FIG. 5 is a SOI dynamic logic circuit diagram showing a further embodiment of the instant invention.

Another embodiment of the instant invention for a SOI dynamic logic circuit is illustrated in FIG. 5. This embodiment has an output logic function of A+B and logic inputs of A 230 and B 240. The precharge PMOS transistor 210 and the NMOS ground switch transistor 220 are connected to a clock signal 235. Although both 210 and 220 are shown tied to the same clock signal 235 it is possible to have independent clock signals driving either transistor. In this embodiment the PDN 265 comprises a series connection of PMOS transistors 272 and 282. In a further embodiment one of the transistors in the PDN 265 has the gate tied to the floating substrate 320. During the precharge phase (when the clock 235 is low) the output node 252 will be charged high to approximately $V_{DD}$ 290 through the PMOS precharge transistor 210. During the subsequent discharge or logic phase (when the clock 235 is high) if both logic inputs A 230 and B 240 are low the output node 250 will be pulled-down by the PDN 265 to a value close to the circuit ground 300. The transistors 272 and 282 thus provide a potential conductive path from the output node 252 to the circuit ground 300. This is to be contrasted with a bulk CMOS circuit implementing the same logic function where the PDN comprises NMOS transistors. The circuit of FIG. 5 can be extended to any number of series connected PMOS transistors in the PDN 265. In addition, the circuit shown in FIG. 5 could be a subset of a larger circuit. Thus logic inputs A 230 and B 240 could be provided by addition circuitry 262 and the logic output 250 could be connected to the other circuits 264.

Figure 6:
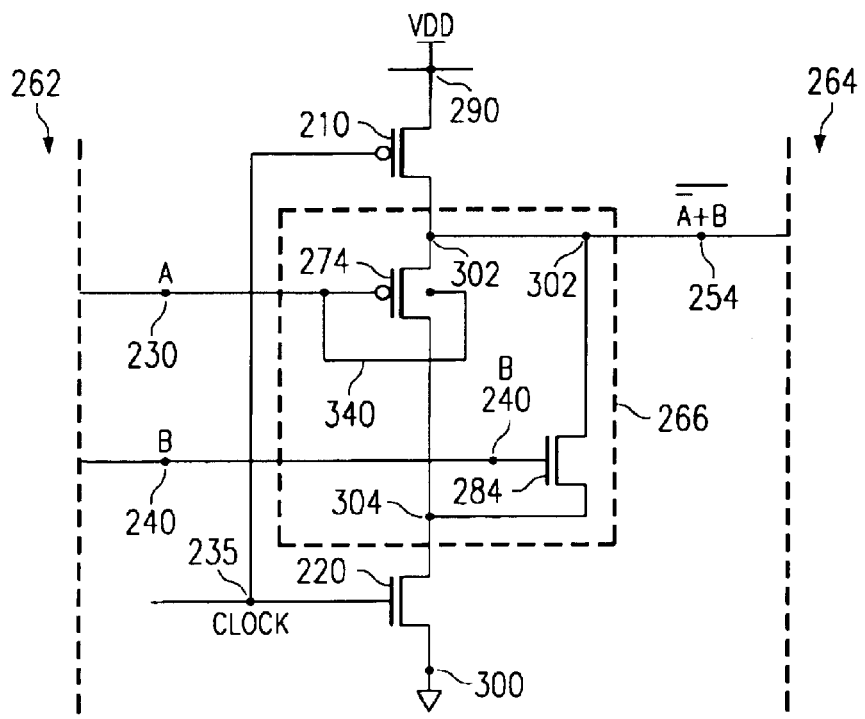
FIG. 6 is a SOI dynamic logic circuit diagram showing a further embodiment of the instant invention.

An further embodiment of the instant invention for a SOI dynamic logic circuit is illustrated in FIG. 6. This embodiment has an output logic function of $\overline{A \cdot B}$ and logic inputs of A 230 and B 240. The precharge PMOS transistor 210 and the NMOS ground switch transistor 220 are connected to a clock signal 235. Although both 210 and 220 are shown tied to the same clock signal 235 it is possible to have independent clock signals driving either transistor. In this embodiment the PDN 266 comprises a parallel connection of a PMOS transistor 274 and a NMOS transistor 284. In a further embodiment one of the transistors in the PDN 266 has the gate tied to the floating substrate 340. This parallel connection results in a pair of common circuit nodes 302 and 304. Circuit node 302 is connected to the output node 254 and the precharge transistor 210. Circuit node 304 is connected to the ground switch transistor 220. During the precharge phase (when the clock 235 is low) the output node 254 will be charged high to approximately $V_{DD}$ 290 through the PMOS precharge transistor 210. During the subsequent discharge or logic phase (when the clock 235 is high) if either logic input A 230 is low or logic input B 240 is high, the output node 254 will be pulled-down by the PDN 266 to a value close to the circuit ground 300. The transistors 274 and 284 thus provide a potential conductive path from the output node 254 to the circuit ground 300. This is to be contrasted with a bulk CMOS circuit implementing the same logic function where the PDN comprises NMOS transistors. The circuit of FIG. 6 can be extended to any number of parallel connected PMOS and NMOS transistors in the PDN 266. In addition, the circuit shown in FIG. 6 could be a subset of a larger circuit. Thus logic inputs A 230 and B 240 could be provided by addition circuitry 262 and the logic output 250 could be connected to the other circuits 264.

Figure 7:
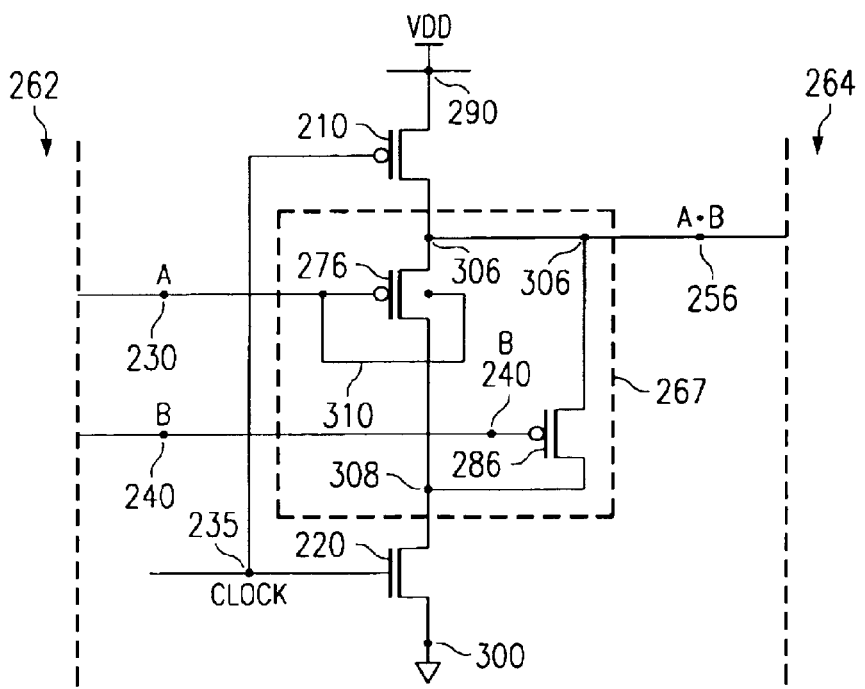
FIG. 7 is a SOI dynamic logic circuit diagram showing a further embodiment of the instant invention.

A further embodiment of the instant invention for a SOI dynamic logic circuit is illustrated in FIG. 7. This embodiment has an output logic function of A●B and logic inputs of A 230 and B 240. The precharge PMOS transistor 210 and the NMOS ground switch transistor 220 are connected to a clock signal 235. Although both 210 and 220 are shown tied to the same clock signal 235 it is possible to have independent clock signals driving either transistor. In this embodiment the PDN 267 comprises a parallel connection of a PMOS transistors 276 and 286. This parallel connection results in a pair of common circuit nodes 306 and 308. Circuit node 306 is connected to the output node 256 and the precharge transistor 210. Circuit node 308 is connected to the ground switch transistor 220. During the precharge phase (when the clock 235 is low) the output node 256 will be charged high to approximately VDD 290 through the PMOS precharge transistor 210. During the subsequent discharge or logic phase (when the clock 235 is high) if either logic input A 230 is low or logic input B 240 is low, the output node 256 will be pulled-down by the PDN 267 to a value close to the circuit ground 300. The transistors 276 and 286 thus provide a potential conductive path from the output node 256 to the circuit ground 300. This is to be contrasted with a bulk CMOS circuit implementing the same logic function where the PDN comprises NMOS transistors. The circuit of FIG. 6 can be extended to any number of parallel connected PMOS and NMOS transistors in the PDN 267. In addition, the circuit shown in FIG. 7 could be a subset of a larger circuit. Thus logic inputs A 230 and B 240 could be provided by addition circuitry 262 and the logic output 256 could be connected to the other circuits 264.

As stated above, circuit performance of the dynamic SOI logic circuits of the instant invention can be improved using low threshold voltage techniques such as electrically connecting the transistor gate to the floating body of the SOI transistor. The gate-to-body connection can be applied to the PMOS transistors and NMOS transistors in a PDN. A gate to floating body connection 310 is shown in FIG. 7 for a PMOS transistor in the PDN 267. The gate-to-body connection utilizes the body effect of the MOSFET transistor to lower the threshold voltage thus improving the transistor performance. The SOI dynamic logic circuits described in the instant invention can also be applied to bulk CMOS circuits. Thus the embodiments of the invention illustrated in FIGS. 4–7 can be applied to bulk substrates that do not have a buried dielectric layer. In the bulk CMOS embodiment of the instant invention, the source/drain diffusions of the PMOS transistor will not abut the source/drain diffusions of the NMOS transistor under current bulk CMOS transistor isolation schemes. The advantages gain by using the disclosed static logic design over existing bulk CMOS static logic designs will be in the speed and performance of the logic circuits.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A dynamic logic circuit on a SOI substrate, comprising:
 a pull-down network comprising a plurality of series connected MOS transistors wherein at least one of said plurality of series connected MOS transistors is a NMOS transistor and at least one of said plurality of series connected MOS transistors is a PMOS transistor;
 a precharge circuit connected to a clock signal, a circuit supply voltage, and said pull-down network;
 a ground switch circuit connected to said clock signal and to said pull-down network; and
 an output node which is connected to a common node of said pull-down network and said precharge circuit.

2. The dynamic logic circuit of claim 1 wherein said precharge circuit comprises a PMOS transistor.

3. The dynamic logic circuit of claim 1 wherein said ground switch circuit comprises a NMOS transistor.

4. The dynamic logic circuit of claim 1 wherein at least one of said MOS transistors in said pull-down network has a gate tied to a floating substrate body.

5. A dynamic logic circuit on a SOI substrate, comprising:
 a pull-down network comprising a plurality of series connected PMOS transistors;

a precharge circuit connected to a clock signal, a circuit supply voltage, and said pull-down network;

a ground switch circuit connected to said clock signal and to said pull-down network; and an output node which is connected to a common node of said pull-down network and said precharge circuit.

6. The dynamic logic circuit of claim 5 wherein said precharge circuit comprises a PMOS transistor.

7. The dynamic logic circuit of claim 5 wherein said ground switch circuit comprises a NMOS transistor.

8. A dynamic logic circuit on a SOI substrate, comprising:

a pull-down network comprising a plurality of series connected PMOS transistors wherein at least one of said MOS transistors in said pull-down network has a gate tied to a floating substrate body;

a precharge circuit connected to a clock signal, a circuit supply voltage, and said pull-down network;

a ground switch circuit connected to said clock signal and to said pull-down network; and an output node which is connected to a common node of said pull-down network and said precharge circuit.

9. A dynamic logic circuit on a SOI substrate, comprising:

a pull-down network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor;

a precharge circuit connected to a clock signal and to said first common node of said pull-down network;

a ground switch circuit connected to said clock signal and to said second common node of said pull-down network; and an output node which is connected to said first common node of said pull-down network.

10. The dynamic logic circuit of claim 9 wherein said precharge circuit comprises a PMOS transistor.

11. The dynamic logic circuit of claim 9 wherein said ground switch circuit comprises a NMOS transistor.

12. A dynamic logic circuit on a SOI substrate, comprising:

a pull-down network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor and at least one of said MOS transistors in said pull-down network has a gate tied to a floating substrate body;

a precharge circuit connected to a clock signal and to said first common node of said pull-down network;

a ground switch circuit connected to said clock signal and to said second common node of said pull-down network; and an output node which is connected to said first common node of said pull-down network.

13. A dynamic logic circuit on a SOI substrate, comprising:

a pull-down network comprising a plurality of parallel connected PMOS transistors with a first and second common node;

a precharge circuit connected to a clock signal and to said first common node of said pull-down network;

a ground switch circuit connected to said clock signal and to said second common node of said pull-down network; and an output node connected to said first common node of said pull-down network.

14. The dynamic logic circuit of claim 13 wherein said precharge circuit comprises a PMOS transistor.

15. The dynamic logic circuit of claim 13 wherein said ground switch circuit comprises a NMOS transistor.

16. A dynamic logic circuit on a SOI substrate, comprising:

a pull-down network comprising a plurality of parallel connected PMOS transistors with a first and second common node wherein at least one of said MOS transistors in said pull-down network has a gate tied to a floating substrate body;

a precharge circuit connected to a clock signal and to said first common node of said pull-down network;

a ground switch circuit connected to said clock signal and to said second common node of said pull-down network; and an output node connected to said first common node of said pull-down network.

* * * * *